US009584152B1

United States Patent
Sheng et al.

(10) Patent No.: US 9,584,152 B1
(45) Date of Patent: Feb. 28, 2017

(54) CURRENT STEERING DIGITAL TO ANALOG CONVERTER WITH DUAL CURRENT SWITCH MODULES

(71) Applicant: Euvis, Inc., Newbury Park, CA (US)

(72) Inventors: Neng-Haung Sheng, Newbury Park, CA (US); Cheh-Ming Jeff Liu, Newbury Park, CA (US)

(73) Assignee: Euvis, Inc., Newbury Park, CA (US)

( * ) Notice: Subject to any disclaimer, the term of this patent is extended or adjusted under 35 U.S.C. 154(b) by 0 days.

(21) Appl. No.: 15/185,734

(22) Filed: Jun. 17, 2016

Related U.S. Application Data

(60) Provisional application No. 62/279,169, filed on Jan. 15, 2016.

(51) Int. Cl.
 *H03M 1/66* (2006.01)
 *H03M 1/08* (2006.01)

(52) U.S. Cl.
 CPC ............ *H03M 1/66* (2013.01); *H03M 1/0863* (2013.01)

(58) Field of Classification Search
 CPC .... H03M 1/66; H03M 1/0863; H03M 1/0678; H03M 1/742; H03M 1/745; H03M 1/747
 USPC ......................................... 341/118, 136, 144
 See application file for complete search history.

(56) References Cited

U.S. PATENT DOCUMENTS

| | | | |
|---|---|---|---|
| 5,164,725 A | * | 11/1992 | Long ................... H03M 1/0643 341/118 |
| 6,768,438 B1 | | 7/2004 | Schofield et al. |
| 6,794,924 B2 | | 9/2004 | Curry et al. |
| 7,071,858 B2 | * | 7/2006 | Pan ..................... H03K 19/1738 327/359 |
| 8,816,889 B2 | | 8/2014 | Teterwak |
| 9,118,346 B2 | * | 8/2015 | Courcy ................... H03M 1/66 |

OTHER PUBLICATIONS

Analog Devices, 11-/14-Bit, 5.7 GSPS, RF Digital-to-Analog Converter, AD9119/AD9129, 68 pages.

(Continued)

*Primary Examiner* — Khai M Nguyen
(74) *Attorney, Agent, or Firm* — Rothwell, Figg, Ernst & Manbeck, P.C.

(57) ABSTRACT

A current-steering digital-to-analog converter may include dual current switch modules configured to receive digital input bits representative of desired analog output, and each dual current switch module may be controlled by one of the digital input bits. Each digital input bit may be represented by differential signals. The positive input and the negative input to drive two separate current switches in the dual current switch module may be separated, which may make the switching transition noise generated in the two current switches have a 180 degree phase difference. The output currents of these two current switches may be summed in proper phase to add the in-phase signal currents while canceling out the 180 degree out-of-phase switching noises generated in the two current switches. The $2^{nd}$ order harmonic distortion and other higher even order harmonic distortions due to the common mode switching noise may be greatly reduced.

14 Claims, 6 Drawing Sheets

(56) References Cited

OTHER PUBLICATIONS

Van de Sande, Frank, et al., A 7.2 GSa/s, 14 Bit or 12 GSa/s, 12 Bit Signal Generator on a Chip in a 165 GHz fT BiCMOS Process, IEEE Journal of Solid-State Circuits, vol. 47, No. 4, Apr. 2012, pp. 1003-1012.

McMahill, Daniel R., "A 160 Channel QAM Modulator With 4.6 Gsps 14 Bit DAC," IEEE Journal of Solid-State Circuits, vol. 49, No. 12, Dec. 2014, pp. 2878-2890.

* cited by examiner

CURRENT STEERING DIGITAL TO ANALOG CONVERTER WITH DUAL CURRENT SWITCH MODULES

CROSS-REFERENCE TO RELATED APPLICATION

The present application claims the benefit of priority to U.S. Provisional Application Ser. No. 62/279,169, filed on Jan. 15, 2016, which is incorporated herein by reference in its entirety.

BACKGROUND

Field of Invention

The present invention relates to digital-to-analog conversion, including methods and circuits to improve the spur-free-dynamic range (SFDR) and to minimize spurs associated with even harmonic distortions at high frequencies of a high speed current steering digital-to-analog converter (DAC).

Discussion of the Background

Recent advances in wireless communication systems and the unprecedented surge in demand for high data rates have led to developments of DACs in the Giga-Herz (GHz) space to generate wideband radio-frequency (RF) signals from digital inputs. These applications typically have great demand on the digital-to-analog converter (DAC) linearity at high speed to increase the spur-free-dynamic range (SFDR). The high-frequency behavior of the DAC is typically dominated by dynamic distortions, although static linearity is necessary but not sufficient. Those skilled in the art know that among the various existing DAC architectures, current-steering DAC architecture is the primary choice for the high frequency wideband applications. In such current steering architectures, for high speed operation, the most-significant bits (MSBs) are typically implemented with the thermometer-code decoder, while the least-significant bits (LSBs) are implemented with the R-2R binary-weighted design 102, as shown in FIG. 1, in which the incoming binary signals are translated into drive signals for the current switch modules 104. The differential digital drive signals steer the current source in each current switch module 104 to one of the DAC differential outputs OUTP and OUTN. Typically, these currents are converted to voltages outside the DAC cell using resistors, or a combination of resistors and other passive components such as transformers or balun, as represented by the output network 106 in FIG. 1.

Despite their popularity at high-speeds, current-steering DACs are affected by dynamic non-linearity. These are the dynamic errors caused by device and interconnect parasitic, finite output impedance of current sources, code-dependent output impedance of DAC, glitches due to timing mismatch between digital driving signals and glitches caused by asymmetry in the settling behavior of current sources. These dynamic errors cause the SFDR performance of current steering DAC to fall rapidly with increases in signal frequency and clock rate.

Research has focused on circuit architectures and designs to minimize the $3^{rd}$ order harmonic (3 HD) distortion and its related odd harmonic spurs caused by those dynamic errors. Research has not focused on minimizing even order harmonic related spurs, mainly because the even harmonics of the differential output configuration can be cancelled out in theory using balun or transformers in the output network to combine DAC outputs differentially. These methods had been quite effective at relatively low speed DAC with lower output frequencies.

However, as the DAC speed increases, even order harmonic spurs, particularly second order harmonic distortion (2 HD) spur, increase rapidly and will be folded back into the Nyquist band. As examples, for output frequencies located between ¼ to ½ of the Nyquist band, the 2 HD spurs will show up in the second half of the Nyquist band. For higher output frequencies located in the second half of the Nyquist band, the 2 HD spurs will be folded back into the whole Nyquist band. All the spurs inside the Nyquist band cannot be filtered out for wideband applications. Since even order harmonic distortions co-exist in both complementary DAC outputs, ideally any method in the output network that can combine the two DAC outputs differentially will cancel out those even harmonic distortions, assuming the time delays for both outputs to arrive at the output network are the same. The same amount of mismatch of those two time delays will induce more phase difference at high frequencies and greatly reduce the effectiveness of even harmonic cancellation relying on the output network. More than that, the designs of prior art methods, such as balun, transformer or active linear amplifiers at high frequencies with wide bandwidth, create challenges for advanced applications. As an example, high frequency broadband balun are not popularly available. Moreover, the frequency response of a wideband balun typically is not flat and has low cut-off frequency. Both of these characteristics are not desirable for many high frequency wideband applications.

The problems of SFDR of high speed DAC limited by even harmonic distortions has been discussed in the literature. For example, one of the state-of-the-art high speed DACs was discussed by Van de Sande, F. et al, "A 7.2 GSa/s, 14 Bit or 12 GSa/s, 12 Bit Signal Generator on a Chip in a 165 GHz ft BiCMOS Process," *Solid-State Circuits, IEEE Journal of,* vol. 47, no. 4, pp. 1003, 1012, April 2012 ("Sande"). The authors concluded from the measurement data that "For all $F_{OUT}$, the SFDR is dominated by the (direct or folded) second or third harmonics: 2 $F_{OUT}$, $F_s$–2 $F_{OUT}$; 3 $F_{OUT}$; $F_s$–3 $F_{OUT}$". As shown in FIG. 11 of Sande, the highest spur is the folded 2 HD $F_s$–2 $F_{OUT}$. Even the measured data was taken with cascaded stages of balun to cancel the even harmonic spurs and other common mode noise.

A similar problem exists in commercial high speed DAC products. One example is shown in the Analog Devices, "AD9119/AD9129 11-/14-Bit, 5.7 GSPS, RF Digital-to-Analog Converter Data Sheet [Rev. A]", September 2013 (the "AD9119/9129 data sheet") in which the folded 2HD spur limits the SFDR to be 50 dB. See AD9119/9129 data sheet at FIG. 13. Even a balun was used at the outputs in the measurement to reduce even harmonic spurs.

There exists a need in the art for an improved high speed high frequency digital to analog converter.

SUMMARY

Aspects of the present invention overcome the disadvantages of conventional high speed high frequency digital to analog converter designs by providing, among other advantages, reduced even order harmonics using simple on-chip solutions. Aspects of the present invention may minimize all direct 2 HD and other even harmonic distortions and its related harmonics folded into the Nyquist band to increase the SFDR. While the invention will be described in connection with certain embodiments, it will be understood that the invention is not limited to those embodiments. To the contrary, this invention includes all alternatives, modifications, and equivalents as may be included within the spirit and scope of the present invention. The use of bipolar transistors in the illustrations is only for the purpose of explanation, and, in alternative embodiments, the invention may be used in other process technologies (including but not limited to CMOS, III-V and HBT, such as SiGe, GaN, GaAs etc.)

One aspect of the present invention relates to a method to reduce the high frequency spurs due to second and other higher even order harmonic distortions either direct in-band or folded back into the Nyquist band. The method may include providing two differential current switches for each unit of the current switch module. The current switch module is referred to as dual current switch module in this disclosure. Each of the differential current switches in such dual current switch module may have its own current source, and the current sources may be identical. Each dual current switch module may receive one pair of differential signals representing one digital bit. The common mode voltage of the complementary data inputs may be derived as a fixed DC reference voltage, Vref. The positive data input and the DC reference voltage Vref may drive the first current switch in the dual current switch module, and the negative data input and the DC reference voltage Vref may drive the second current switch of the same dual current switch module. By separating the positive data input and the negative data input to drive two separate current switches, the switching transition noise at the common emitter node of the switch transistors in each current switch may follow the data rate, but with nearly 180 degree out-of-phase relative to each other. The output currents steered by these two current switches summed in proper phase to add the in-phase signal output currents while the 180 out-of-phase switching noise generated in both current switches cancels with each other. The 2 HD and other even order harmonic distortions due to the common mode switching noise may therefore be greatly reduced.

Another aspect of the present invention relates to a dual current switch module configured to receive a pair of complementary differential signal inputs representing one digital bit. The dual current switch module may include first and second differential current outputs, a first current switch, and a second current switch. The first current switch may include a first switch transistor, a second switch transistor, and a first current source connected to a common emitter node of the first and second switch transistors. The first and second switch transistors may be configured to steer the first current source to one of the first and second differential current outputs. The second current switch may include a third switch transistor, a fourth switch transistor, and a second current source connected to a common emitter node of the third and fourth switch transistors. The third and fourth switch transistors may be configured to steer the second current source to one of the first and second differential current outputs.

In some embodiments, the first switch transistor of the first current switch may be configured to receive one of the complimentary differential signal inputs, the third switch transistor of the second current switch may be configured to receive the other of the complimentary differential signal inputs, and the second switch transistor of the first current switch and the fourth switch transistor of the second current switch may be driven by a fixed reference voltage.

In some embodiments, the first current switch may be configured to generate switching noise at the common emitter node of the first and second switch transistors when the input of the first switch transistor transitions through the fixed reference voltage, the second current switch may be configured to generate switching noise at the common emitter node of the third and fourth switch transistors when the input of the third switch transistor transitions through the fixed reference voltage, and the switching noise generated in the first current switch and the switching noise generated in the second current switch may have same magnitude but differ in phase by approximately 180 degrees. In some embodiments, the switching noise generated in the first current switch and the switching noise generated in the second current switch may be complementary with each other with 180 degree phase difference, an output of the first switch transistor of the first current switch may be connected to an output of the fourth switch transistor of the second current switch, and an output of the third switch transistor of the second current switch may be connected to an output of the second switch transistor of the first current switch.

In some embodiments, a collector of the first switch transistor in the first current switch may be connected to a collector of the fourth switch transistor in the second current switch, and a collector of the third switch transistor in the second current switch may be connected to a collector of the second switch transistor in the first current switch. In some embodiments, when the first current switch receives the positive of the complementary differential signal and the second current switch receives the negative of the complementary differential signal, the first switch transistor in the first current switch and the fourth switch transistor in the second current switch may be turned on, the first current source and the switching noise generated in the first current switch may be steered through the turned-on first switch transistor to the first differential current output, the second current source and the switching noise generated in the second current switch may be steered through the turned-on fourth switch transistor to the first differential current output, and the first and second current sources and the switching noise of both the first and second current switches may be summed at the first differential current output. In some embodiments, when the second current switch receives the positive of the complimentary differential signal and the first current switch receives the negative of the complimentary differential signal, the first and second current sources and the switching noise of both the first and second current switches may be summed at the second differential current output node. In some embodiments, after summation, the switching noise from both the first and second current switches may cancel with each other to reduce the second order harmonic distortion and other higher order even harmonics induced spurs.

In some embodiments, the dual current switch module may include first and second cascode transistors. In some embodiments, the current outputs of the first and second current switches may be summed to provide two output currents that go through one or more of the first and second cascode transistors.

In some embodiments, the dual current switch module may include first and second cascode transistors. In some embodiments, the current outputs of the first and second current switches may go through one or more of the first and second cascode transistors and may then summed to provide two output currents.

Yet another aspect of the present invention relates to a current steering digital-to-analog converter (DAC). The DAC may include a plurality of dual current switch modules configured to receive a plurality of digital bits representative of a desired analog output voltage. Each of the dual current switch modules may be configured to receive a pair of complementary differential signal inputs representing one digital bit of the plurality of digital bits. Each of the dual current switch modules may include first and second differential current outputs, a first current switch, and a second current switch. The first current switch may include a first switch transistor, a second switch transistor, and a first current source connected to a common emitter node of the first and second switch transistors. The first and second switch transistors may be configured to steer the first current source to one of the first and second differential current outputs. The second current switch may include a third switch transistor, a fourth switch transistor, and a second current source connected to a common emitter node of the third and fourth switch transistors. The third and fourth switch transistors may be configured to steer the second current source to one of the first and second differential current outputs.

BRIEF DESCRIPTION OF THE DRAWINGS

The accompanying drawings, which are incorporated herein and form part of the specification, illustrate various, non-limiting embodiments of the present invention. In the drawings, like reference numbers indicate identical or functionally similar elements.

DETAILED DESCRIPTION OF PREFERRED EMBODIMENTS

While the disclosure may be described in conjunction with an illustrated embodiment, it may be understood that it is not intended to limit the disclosure to such embodiment. To the contrary, it is intended to cover all alternatives, modifications, and equivalents as may be included within the spirit and scope of the disclosure as defined by the appended claims. Thus, the embodiments of the present disclosure are only provided to explain more clearly the invention to the ordinarily skilled artisan.

Figure 2A:
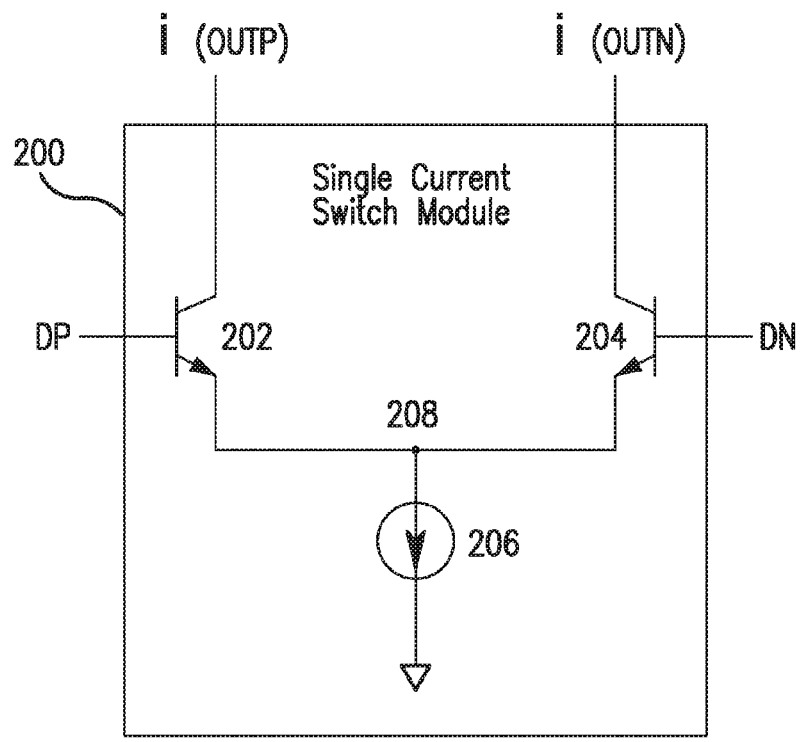
FIG. 2A is a circuit diagram of a conventional current switch module comprising of a single current switch with one current source and receives one digital bit input.

Since the 2 HD and higher even order harmonics related spurs exist in both complementary outputs of the DAC with same amplitude, its source should come from the common mode noise inside the current switch modules. A conventional current switch module 200 used in a current-steering DAC is depicted in FIG. 2A and is referred to as a single current switch module in this disclosure. The single current switch module 200 consists of (i) a pair of switch transistors 202 and 204 as the differential switch to receive differential signals representing one digital bit and (ii) a current source 206, which ideally should be constant. The pair of differential digital inputs DP and DN to the switch 200 steers the current of its current source 206 to one of the DAC outputs OUTP and OUTN.

It is understood by those skilled in the relevant art that one of the most significant sources of the DAC dynamic errors is associated with the common-emitter node 208 of the two switch transistors 202 and 204. For example, the ideal constant current source 206 can be in reality modulated by the switching noise at the common emitter node 208 due to its finite output impedance. This modulation in current source 206 is an example of common mode noise at the DAC outputs.

Basic DC analyses illustrate how the switching noise at this common emitter node 208 differs between the conventional single current switch module 200 and the present disclosure. The voltage at common emitter node 208 follows the base voltage of the switch transistor 202 or 204 that is turned-on by its high input with one base-emitter turned-on voltage, $V_{BE(on)}$ drop. Because the high level of both inputs DP and DN are the same, ideally the voltage at common emitter node 208 should be constant no matter which of either switch transistor 202 and 204 is turned on.

Figure 2B:
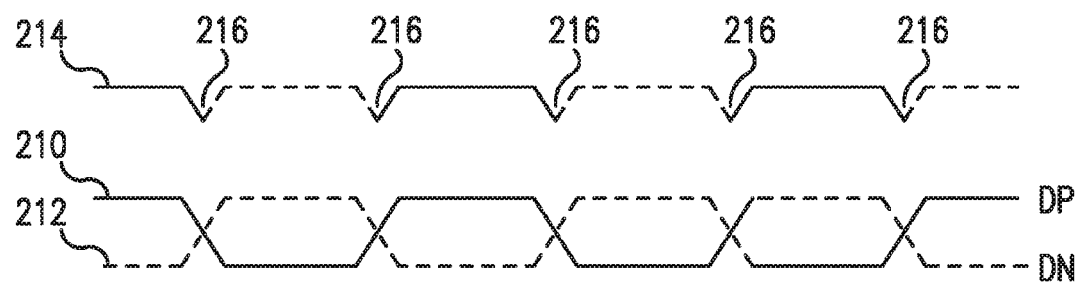
FIG. 2B illustrates waveforms of the conventional current switch module.

FIG. 2B illustrates examples of the voltage waveform 210 of the input DP, the voltage waveform 212 of the input DN, and the voltage waveform 214 at the common emitter node 208. For simplicity of illustration, a periodic data pattern, instead of random pattern, is shown in FIG. 2B. Due to finite rise-fall time of the data inputs DP and DN, the voltage waveform 214 at common node 208 includes a notch 216 following each transition between the inputs DP and DN. Since the notch 216 follows the switching activity of data inputs DP and DN, the switching noise on the common node 208 is therefore input data-dependent and causes nonlinear distortions. There are other glitches generated in the DAC outputs that are also data dependent and cause harmonic distortions including third order harmonics and other odd order harmonics.

Prior art methods attempting to solve the data dependent noise problems by using dummy switches with auxiliary digital data inputs to make the switching glitches periodical with clock cycles and therefore data independent with the goals to minimize third harmonic distortions exist. Although there is more than one current switch in one current switch module in these prior art methods, there is only one main current switch for signal generation while other current switches are dummies. Embodiments of the present invention may reduce the even harmonic distortions derived from the common mode switching noise. As shown in FIG. 2B, the fundamental frequency of the resulted data dependent waveform 214 at common node 208 is twice of the input data rate which causes 2 HD and higher even order harmonics to be generated in DAC both outputs.

General approaches to minimize the dynamic errors due to switching activities at common emitter node 208 include using a cascode current source to increase its output impedance and/or higher speed transistor technologies with unit current gain cutoff frequency $f_T$ greater than 150 GHz to reduce the transition time of data input. At high frequencies, the output impedance of the cascode current source is greatly reduced by the parasitic capacitances. The circuit architecture of embodiments of the present invention has less demand on the speed of the transistor technologies due to single-sided switching activity.

Figure 3A:
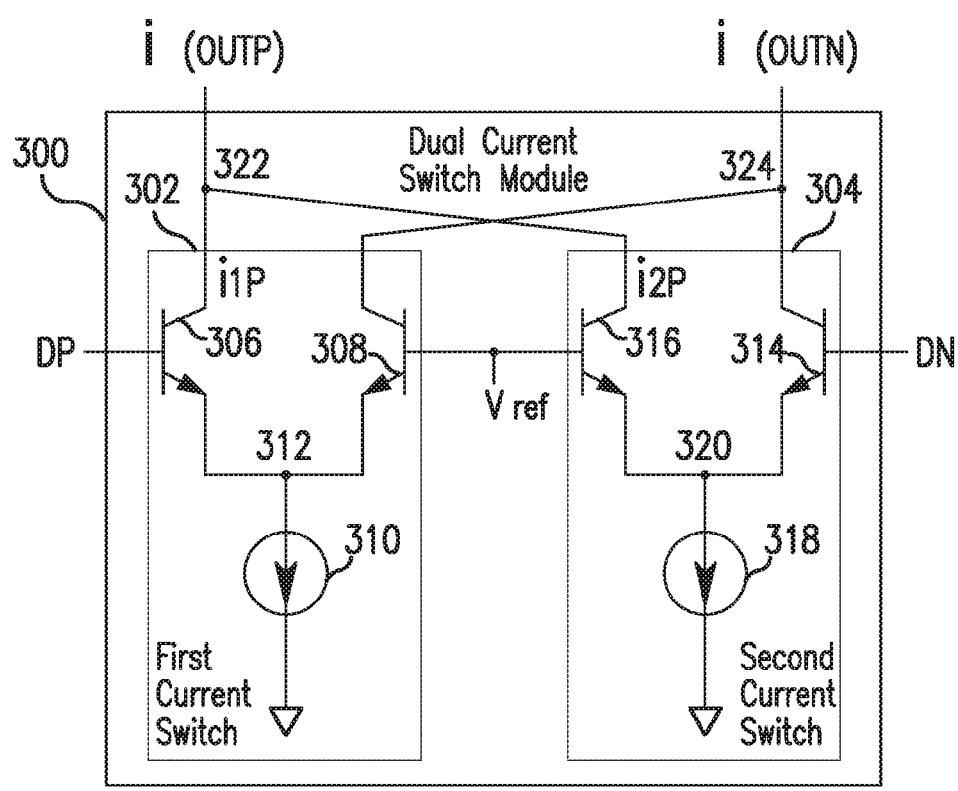
FIG. 3A is a dual current switch module embodying aspects of the present invention. The illustrated dual current switch module comprises two current switches and receives one digital bit input.

FIG. 3A illustrates a current switch module 300 embodying aspects of the present invention and is referred to herein as a dual current switch module. In some embodiments, as illustrated in FIG. 3A, the dual current switch module 300 may comprise first and second current switches 302 and 304 for each pair of differential digital drive signals DP and DN, which represent one digital bit. In some embodiments, the dual current switch module 300 may comprise (i) first and second transistors 306 and 308 as switch transistors of the first current switch 302 and (ii) third and fourth transistors 314 and 316 as switch transistors of the second current switch 304. In some embodiments, a common emitter node 312 of first and second transistors 306 and 308 of the first current switch 302 may be connected to a first unit current source 310. In some embodiments, a common emitter node 320 of third and fourth transistors 314 and 316 of the second current switch 304 may be connected to a second unit current source 318.

In some embodiments, data input DP may drive the first switch transistor 306 of the first current switch 302, and its complement DN may drive the third switch transistor 314 of the second current switch 304. The other transistor in each of the first and second current switches (i.e., second and fourth transistors 308 and 316) may be driven with a fixed bias voltage $V_{ref}$. The "fixed" bias voltage $V_{ref}$ may be the common mode voltage of DP and DN, which can be derived in many ways. For example, one possible embodiment of circuit for generating the fixed bias voltage $V_{ref}$ is shown in FIG. 3C and uses two equal resistors 336 and 338 coupled between inputs DP and DN. Therefore, in some embodiments, dual current switches 302 and 304 may be provided for each current switch module 300 receiving one pair of complementary digital data inputs DP and DN.

In some embodiments, the current at DAC output OUTP may be equal to the sum of the currents through the first and fourth switch transistors 306 and 316. In FIG. 3A, the current at DAC output OUTP is labeled as i(OUTP), the current through the first switch transistor 306 is labeled as i1P, and the current the fourth switch transistor 316 is labeled as i2P. Similarly, in some embodiments, the current at DAC output OUTN may be equal to the sum of the currents through the second and third switch transistors 308 and 314. In FIG. 3A, the current at DAC output OUTN is labeled as i(OUTN).

In some non-limiting embodiments, when data input DP is higher than the fixed bias voltage $V_{ref}$ and its complement DN is lower than the fixed bias voltage $V_{ref}$, first current switch transistor 306 is turned on to steer the current source 310 of the first current switch 302 to the output node 322, and fourth current switch transistor 316 is turned on to steer current source 318 of the second current switch 304 to the same node 322. On the other hand, when data input DP is lower than the fixed bias voltage $V_{ref}$ and its complement DN is higher than the fixed bias voltage $V_{ref}$, second current switch transistor 308 is turned on to steer the current source 310 of the first current switch 302 to node 324 while third current switch transistor 314 is turned on to steer current source 318 of the second current switch 304 to the same node 324. Based on the same DC analyses discussed above, the voltage at common emitter nodes 312 and 320 of switch transistors is one $V_{BE(on)}$ drop of the turned-on switch transistor's base voltage.

As an example for illustration, when DP is high, first switch transistor 306 is turned on, and the voltage at the common emitter node 312 follows the high level of DP with one $V_{BE(on)}$ drop. As the input DP transitions from high level and passes through the fixed bias voltage $V_{ref}$ to low level, the voltage at the common emitter node 312 follows the transition of input DP and stays at $V_{ref}-V_{BE(on)}$ when second switch transistor 308 is turned on and first switch transistor 306 is being turned off. A step function is formed during this transition because fixed bias voltage $V_{ref}$ is a DC voltage in the middle of high and low levels of inputs DP and DN and lower than their high level.

Figure 3B:
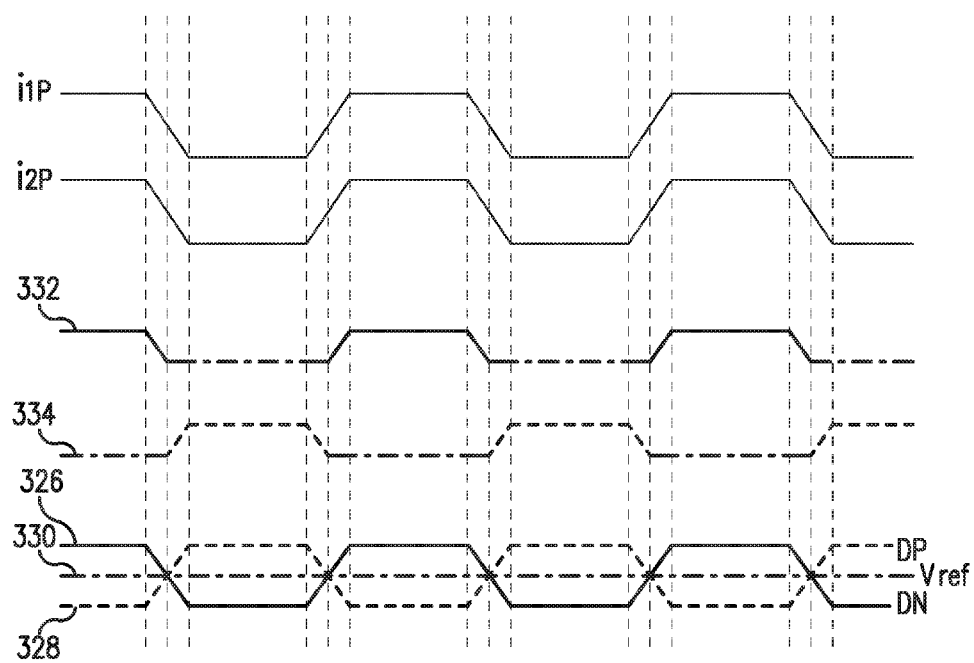
FIG. 3B illustrates waveforms of the dual current switch module of FIG. 3A.
Figure 3C:
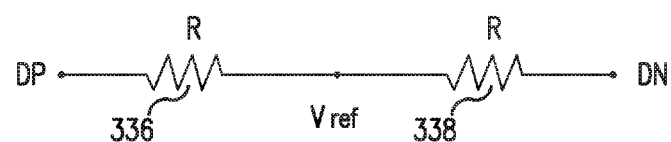
FIG. 3C is an embodiment of a circuit diagram to derive the common mode voltage of the differential inputs as a fixed reference voltage. Each current switch may have its own current source, and the current sources may be identical.

FIG. 3B illustrates examples of the voltage waveform 326 of the input DP, the voltage waveform 328 of the input DN, the voltage waveform 330 of the fixed bias voltage $V_{ref}$, the voltage waveform 332 at the common emitter node 312 for the first current switch 302, the voltage waveform 334 at the common emitter node 320 of the second current switch 304, the waveform of the current i1P through the first switch transistor 306, and the waveform of the current i2P through the fourth switch transistor 316. Here again, for simplicity of illustration, a periodic data pattern, instead of random pattern, is shown in FIG. 3B.

Voltage waveform 332 shows the resulting switching noise at the common emitter node 312 for the first current switch 302, and voltage waveform 334 shows the switching noise at the common emitter 320 for the second current switch 304. The switching noise in both waveforms 332 and 334 is still input data dependent. Nevertheless, the fundamental frequency of common mode noise in both waveforms 332 and 334 is the same as the input data rate instead of being double the input data rate as in the conventional single current switch module 200 (see FIG. 2B). In addition, the phase of the switching noise in waveform 332 differs from the phase of the switching noise in waveform 334 by nearly 180 degree. In other words, the switching noise in waveforms 332 and 334 are nearly complementary. When these two waveforms 332 and 334 pass through the turned-on switch transistors and are summed at one of the output nodes 322 and 324, the out-of-phase switching noise in waveforms 332 and 334 cancel each other while the in-phase signal currents (e.g., i1P and i2P) add up together. Thus, in some embodiments, the dual current switch module 300 may overcome even harmonic distortions induced by the common mode switching noise by generating two out-of-phase switching noise waveforms, which cancel each other when summed at the output nodes 322 and 324.

In some embodiments, during switching transition, only one input of the switch transistors may be toggling while the other switch transistor input may be held at DC voltage, and the resulting switching transient may be smoother than the conventional single current switch module 200 (see FIG. 2B) in which the differential signal inputs to the single differential switch toggle simultaneously and require fast transition edges of the complementary data inputs to minimize the size of the transition notch at the common emitter node. Accordingly, in some embodiments, the dual current switch module 300 may have less demand on the rise/fall time of the transition edge of data inputs. Moreover, in some embodiments, the dual current switch module 300 may be suitable for semiconductor technologies with relatively lower $f_T$.

Figure 4A:
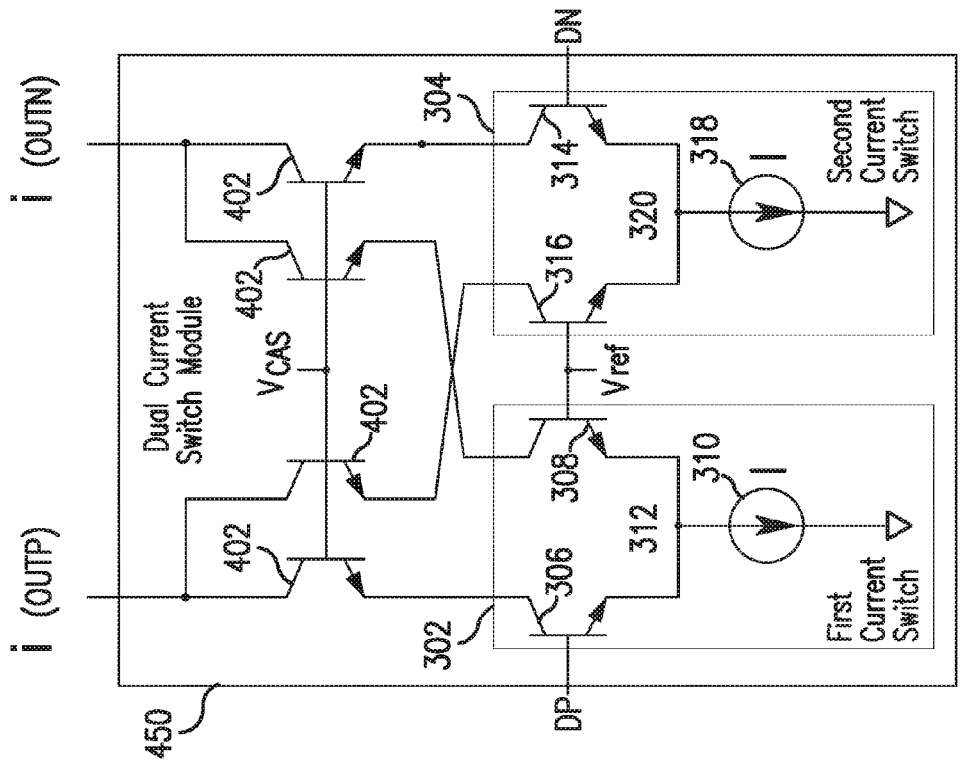
FIGS. 4A and 4B are circuit diagrams illustrating alternative dual current switch modules embodying aspects of the present invention.
Figure 4B:
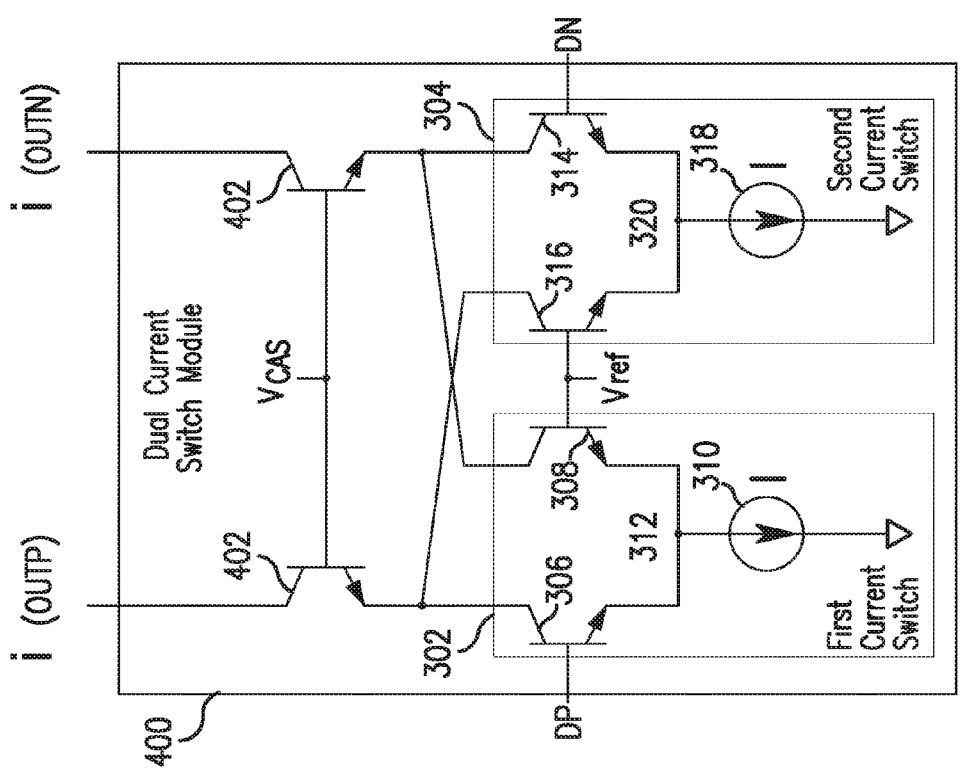

The implementation of the dual current switch module 300 shown in FIG. 3 is just one example of a dual current switch module embodying aspects of the present invention, and, in one or more alternative embodiments, the dual current switch modules may have different implementations. For example, FIGS. 4A and 4B illustrate alternative embodiments of dual current switch modules 400 and 450 embodying aspects of the present invention. As illustrated in FIGS. 4A and 4B, the dual current switch modules 400 and 450 may comprise first and second current switches 302 and 304 for each pair of differential digital drive signals DP and DN, which represent one digital bit. In some embodiments, the dual current switch modules 400 and 450 may additionally comprise cascode transistors 402 at the outputs of the first and second current switches 302 and 304 to increase both the output impedance and the bandwidth. The output currents of the first and second current switches 302 and 304 can be summed at the input of the cascode transistors 402 (as illustrated in FIG. 4A) or directly at the DAC outputs (as illustrated in FIG. 4B).

Figures 5A, 5B:
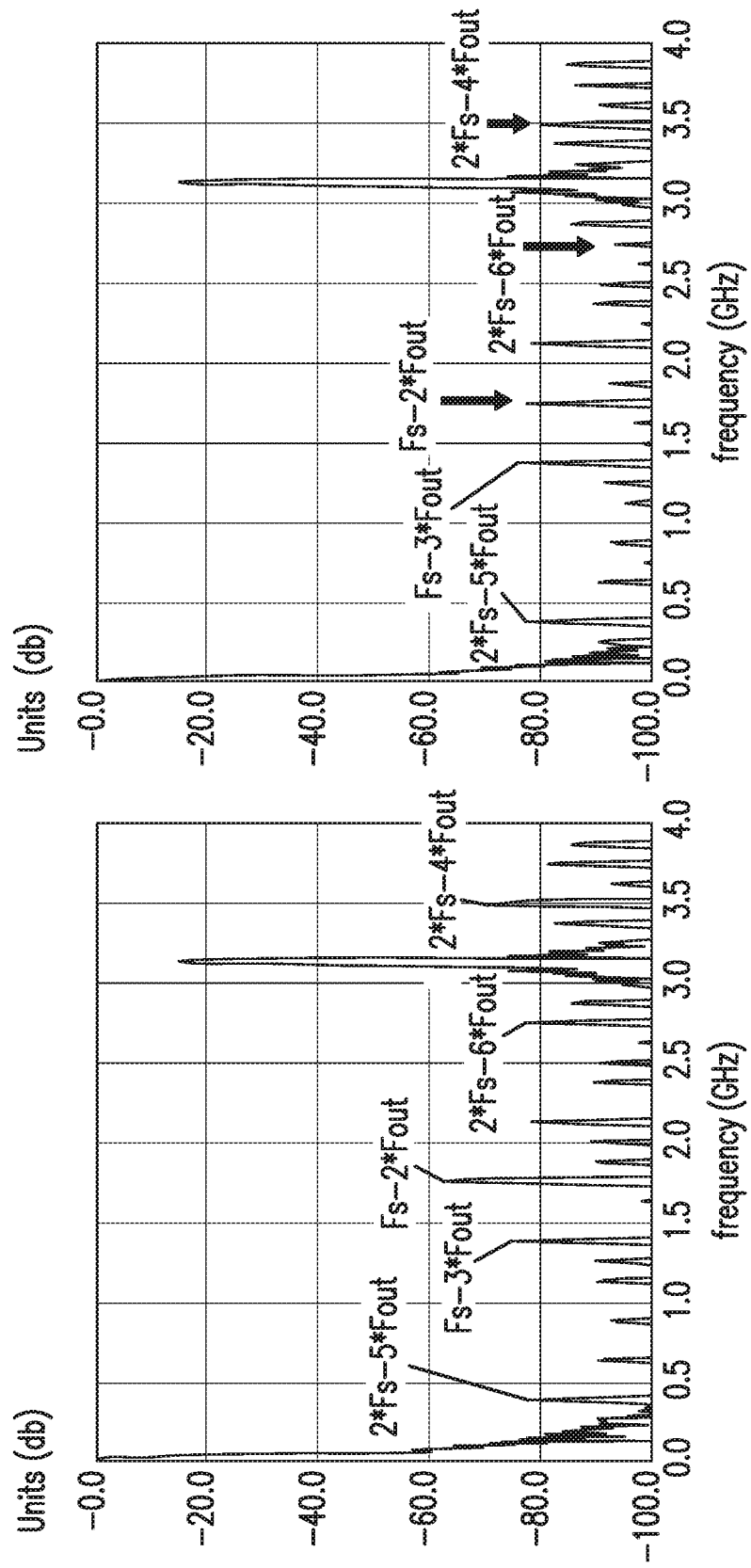
FIGS. 5A and 5B are simulation results to compare a 12-bit DAC implemented with the single current switch module and a dual current switch module embodying aspects of the present invention, respectively. The signal frequency is 25/64 of the sampling rate. The main harmonics related spurs are labeled for comparison.

As noted above, in some embodiments, the dual current switch module may substantially reduce 2 HD and higher order even harmonic distortions for high speed wideband current steering DAC when compared with prior art designs. This can be seen in the simulated results shown in FIGS. 5A and 5B, which compare spur-free-dynamic range (SFDR) values for (a) a conventional 12-bit DAC with single current switch modules (see FIG. 5A) and (b) the same DAC architecture implemented with dual current switch modules in accordance with embodiments of the present invention (FIG. 5B). Both DACs were operated at 8 GHz with Nyquist band from DC to 4 GHz. The transistor technology for the simulation has $f_T$ of 75 GHz. These spectra were taken from any single ended output of DAC complementary outputs. All harmonics related spurs are labeled in both FIG. 5A for conventional DAC and in FIG. 5B for the DAC in accordance with embodiments of the present invention. The SFDR in the conventional DAC was limited to be 48 dB by the folded 2 HD which is increased to 62.5 dB in the DAC of the current invention. Near 15 dB improvements in the folded 2 HD were observed and no longer is the SFDR limiting spur for the DAC with the current invention compared to prior art. In addition, 6 dB improvements in the folded $4^{th}$ order harmonic distortion and 9 dB improvements in the folded $6^{th}$ order harmonic distortion were observed while no changes in all odd order harmonic related spurs.

Figure 1:
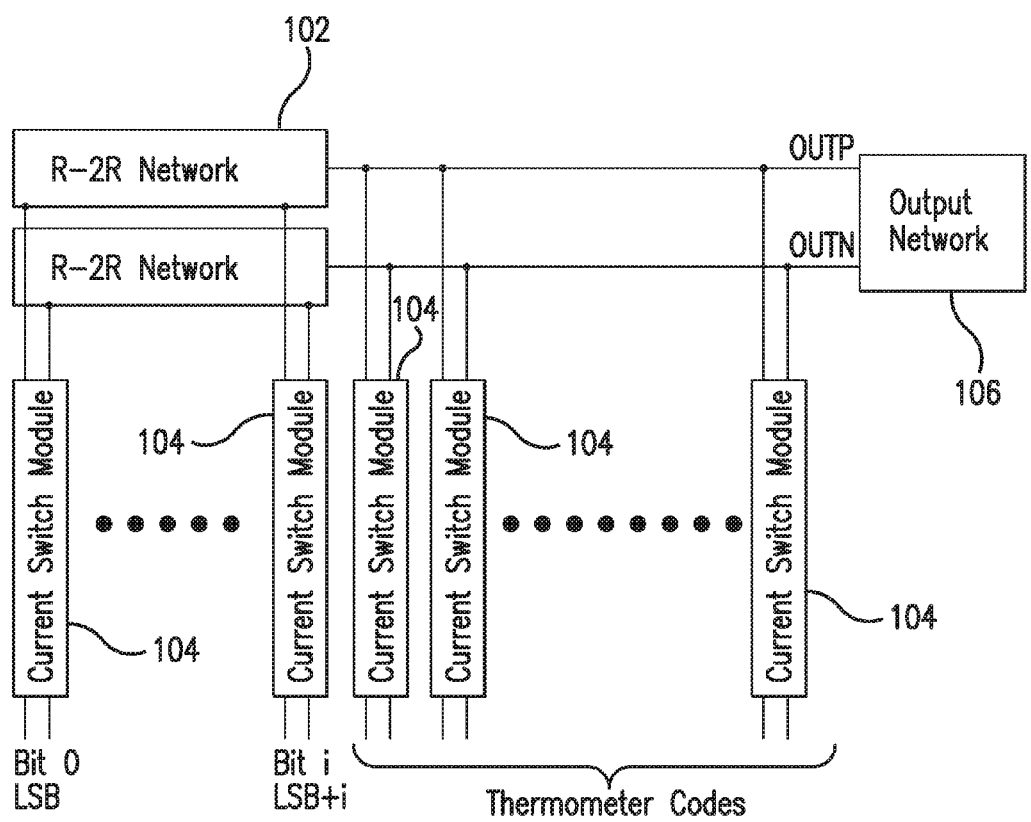
FIG. 1 is a block diagram of a differential current steering DAC configured in a standard R-2R binary-weighting combined with segmented DAC architecture. Each current switch module receives one digital bit represented by differential signals.

In some embodiments, one or more dual current switch modules (e.g., one or more dual current switch modules 300, 400, or 450) may be used in place of one or more of the current switch modules 104 of the differential current steering DAC shown in FIG. 1. In some alternative embodiments, one or more dual current switch modules may be used in current steering DACs having interleaved sub-DACs, DACs with Return-to-Zero output mode, DACs with RF output mode, and/or DACs with high output power.

Although FIGS. 3A, 4A, and 4B depict dual current switch module embodiments in a DAC implemented with NPN transistors, this is not required. For example, the present invention is equally applicable to alternative implementations, such as, for example and without limitation, implementations employing PNP transistors, NMOS FETs, PMOS FETS, CMOS circuits, or various combinations of these.

Embodiments of the present invention may be suited for any resolution, current-steering, GHz digital-to-analog converters, either as a standalone application or as subcomponents incorporated into other systems including, for example and without limitation, wideband radio frequency signal processing and general purpose baseband communications, instrumentation, radar, and electronic warfare systems.

It may be apparent to those having ordinary skill in this art that various modifications and variations may be made to the embodiments disclosed herein, consistent with the present disclosure, without departing from the spirit and scope of the present disclosure. Other embodiments consistent with the present disclosure may become apparent from consideration of the specification and the practice of the devices and methods disclosed herein.

What is claimed is:

1. A dual current switch module configured to receive a pair of complementary differential signal inputs representing one digital bit, the dual current switch module comprising:
   first and second differential current outputs;
   a first current switch comprising a first switch transistor, a second switch transistor, and a first current source connected to a common emitter node of the first and second switch transistors, wherein the first and second switch transistors are configured to steer the first current source to one of the first and second differential current outputs; and
   a second current switch comprising a third switch transistor, a fourth switch transistor, and a second current source connected to a common emitter node of the third and fourth switch transistors, wherein the third and fourth switch transistors are configured to steer the second current source to one of the first and second differential current outputs;
   wherein the first and second current sources produce equal currents.

2. A dual current switch module configured to receive a pair of complementary differential signal inputs representing one digital bit, the dual current switch module comprising:
   first and second differential current outputs;
   a first current switch comprising a first switch transistor, a second switch transistor, and a first current source connected to a common emitter node of the first and second switch transistors, wherein the first and second switch transistors are configured to steer the first current source to one of the first and second differential current outputs; and
   a second current switch comprising a third switch transistor, a fourth switch transistor, and a second current source connected to a common emitter node of the third and fourth switch transistors, wherein the third and fourth switch transistors are configured to steer the second current source to one of the first and second differential current outputs;
   wherein the first switch transistor of the first current switch is configured to receive one of the complimentary differential signal inputs, the third switch transistor of the second current switch is configured to receive the other of the complimentary differential signal inputs, and the second switch transistor of the first current switch and the fourth switch transistor of the second current switch are driven by a fixed reference voltage.

3. The dual current switch module of claim 2, wherein the first current switch is configured to generate switching noise at the common emitter node of the first and second switch transistors when the input of the first switch transistor transitions through the fixed reference voltage, the second current switch is configured to generate switching noise at the common emitter node of the third and fourth switch transistors when the input of the third switch transistor transitions through the fixed reference voltage, and the switching noise generated in the first current switch and the switching noise generated in the second current switch have same magnitude but differ in phase by approximately 180 degrees.

4. The dual current switch module of claim 3, wherein the switching noise generated in the first current switch and the switching noise generated in the second current switch are complementary with each other with 180 degree phase difference, an output of the first switch transistor of the first current switch is connected to an output of the fourth switch transistor of the second current switch, and an output of the third switch transistor of the second current switch is connected to an output of the second switch transistor of the first current switch.

5. The dual current switch module of claim 4, wherein a collector of the first switch transistor in the first current switch is connected to a collector of the fourth switch transistor in the second current switch;
   wherein a collector of the third switch transistor in the second current switch is connected to a collector of the second switch transistor in the first current switch;
   wherein, when the first switch transistor of the first current switch receives the positive of the complementary differential signal and the third switch transistor of the second current switch receives the negative of the complementary differential signal, the first switch transistor in the first current switch and the fourth switch transistor in the second current switch are turned on, the first current source and the switching noise generated in the first current switch are steered through the turned-on first switch transistor to the first differential current output, the second current source and the switching noise generated in the second current switch are steered through the turned-on fourth switch transistor to the first differential current output, and the first and second current sources and the switching noise of both the first and second current switches are summed at the first differential current output;
   wherein, when the third switch transistor of the second current switch receives the positive of the complimentary differential signal and the first switch transistor of the first current switch receives the negative of the complimentary differential signal, the second switch transistor in the first current switch and the third switch transistor in the second current switch are turned on, and the first and second current sources and the switching noise of both the first and second current switches are summed at the second differential current output node; and
   wherein, after summation, the switching noise from both the first and second current switches cancels with each other to reduce the second order harmonic distortion and other higher order even harmonics induced spurs.

6. The dual current switch module of claim 5, further comprising first and second cascode transistors;
   wherein current outputs of the first and second current switches are summed to provide two output currents that go through one or more of the first and second cascode transistors.

7. The dual current switch module of claim 5, further comprising first and second cascode transistors;
   wherein current outputs of the first and second current switches go through one or more of the first and second cascode transistors and are then summed to provide two output currents.

8. A current steering digital-to-analog converter (DAC), comprising:
   a pair of differential analog outputs; and
   a plurality of dual current switch modules of claim 5, wherein the first differential current output of each of the dual current switch modules is connected to one of the pair of differential analog outputs of the DAC to provide one analog output, and the second differential current output of each of the dual current switch modules is connected to the other of the pair of differential analog outputs to provide the complement output.

9. A current steering digital-to-analog converter (DAC), comprising:
   a pair of differential analog outputs; and
   a plurality of dual current switch modules of claim 6, wherein the first differential current output of each of the dual current switch modules is connected to one of the pair of differential analog outputs of the DAC to provide one analog output, and the second differential current output of each of the dual current switch modules is connected to the other of the pair of differential analog outputs to provide the complement output.

10. A current steering digital-to-analog converter (DAC), comprising:
    a pair of differential analog outputs; and
    a plurality of dual current switch modules of claim 7, wherein the first differential current output of each of the dual current switch modules is connected to one of the pair of differential analog outputs of the DAC to provide one analog output, and the second differential current output of each of the dual current switch modules is connected to the other of the pair of differential analog outputs to provide the complement output.

11. The dual current switch module of claim 3, wherein the switching noise at the common emitter node of the first and second switch transistors of the first current switch and the switching noise that the common emitter node of the third and fourth switch transistors of the second current switch have a fundamental frequency, data is input via the complementary differential signal inputs at a input data rate, and the fundamental frequency follows the input data rate.

12. The dual current switch module of claim 11, wherein the fundamental frequency is the same as the input data rate.

13. A current steering digital-to-analog converter (DAC), comprising:
    a plurality of dual current switch modules configured to receive a plurality of digital bits representative of a desired analog output voltage;
    wherein each of the dual current switch modules is configured to receive a pair of complementary differential signal inputs representing one digital bit of the plurality of digital bits;
    wherein each of the dual current switch modules comprises:
        first and second differential current outputs;
        a first current switch comprising a first switch transistor, a second switch transistor, and a first current source connected to a common emitter node of the first and second switch transistors, wherein the first and second switch transistors are configured to steer the first current source to one of the first and second differential current outputs; and
        a second current switch comprising a third switch transistor, a fourth switch transistor, and a second current source connected to a common emitter node of the third and fourth switch transistors, wherein the third and fourth switch transistors are configured to steer the second current source to one of the first and second differential current outputs;

wherein the first and second current sources produce equal currents.

14. A current steering digital-to-analog converter (DAC), comprising:

a plurality of dual current switch modules configured to receive a plurality of digital bits representative of a desired analog output voltage;

wherein each of the dual current switch modules is configured to receive a pair of complementary differential signal inputs representing one digital bit of the plurality of digital bits;

wherein each of the dual current switch modules comprises:

first and second differential current outputs;

a first current switch comprising a first switch transistor, a second switch transistor, and a first current source connected to a common emitter node of the first and second switch transistors, wherein the first and second switch transistors are configured to steer the first current source to one of the first and second differential current outputs; and a second current switch comprising a third switch transistor, a fourth switch transistor, and a second current source connected to a common emitter node of the third and fourth switch transistors, wherein the third and fourth switch transistors are configured to steer the second current source to one of the first and second differential current outputs;

wherein the first switch transistor of the first current switch is configured to receive one of the complimentary differential signal inputs, the third switch transistor of the second current switch is configured to receive the other of the complimentary differential signal inputs, and the second switch transistor of the first current switch and the fourth switch transistor of the second current switch are driven by a fixed reference voltage.

\* \* \* \* \*